(12) United States Patent
Ko

(10) Patent No.: US 7,863,692 B2
(45) Date of Patent: Jan. 4, 2011

(54) SEMICONDUCTOR DEVICE

(75) Inventor: Young-Suk Ko, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 611 days.

(21) Appl. No.: 11/854,670

(22) Filed: Sep. 13, 2007

(65) Prior Publication Data
US 2008/0067616 A1    Mar. 20, 2008

(30) Foreign Application Priority Data
Sep. 20, 2006    (KR)    .................. 10-2006-0090984

(51) Int. Cl.
*H01L 29/94*    (2006.01)
*H01L 21/336*    (2006.01)

(52) U.S. Cl. .............................. 257/408; 257/E29.345; 257/E21.409; 438/297

(58) Field of Classification Search ................. 257/408, 257/344, 345, 327, 336, 395, 371, 369, 349, 257/389, 387, 413, 549–550, E21.193, E29.133, 257/E29.266–E29.269, E29.278–E29.279, 257/E21.435, E21.437, E29.134, E29.152, 257/E29.162, E29.039, E21.149, E21.197, 257/E21.206, E21.43, E21.634, E27.067, 257/E29.04, E29.135, E21.409; 438/295, 438/285

See application file for complete search history.

(56) References Cited

U.S. PATENT DOCUMENTS

2003/0146478 A1* 8/2003 Yen et al. ..................... 257/411
2005/0012087 A1* 1/2005 Sheu et al. .................... 257/14

FOREIGN PATENT DOCUMENTS

KR    2005-0063317    6/2005

* cited by examiner

*Primary Examiner*—Dao H Nguyen
*Assistant Examiner*—Tram H Nguyen
(74) *Attorney, Agent, or Firm*—Sherr & Vaughn, PLLC

(57) ABSTRACT

Embodiments relate to a semiconductor device in which a first oxide layer may be formed in a channel area under the gate electrode. An electric field loaded on the gate electrode may be reduced when electrons are implanted from the source to the drain, the acceleration of electrons may be reduced, and the electrons implanted in the second oxide layer may be restrained. This may improve the hot-carrier effect, resulting in the increased reliability of the semiconductor device.

9 Claims, 3 Drawing Sheets

SEMICONDUCTOR DEVICE

The present application claims priority under 35 U.S.C. 119 and 35 U.S.C. 365 to Korean Patent Application No. 10-2006-0090984 (filed on Sep. 20, 2006), which is hereby incorporated by reference in its entirety.

BACKGROUND

As semiconductor devices become more highly integrated, a distance between the source and the drain of a transistor should be optimized. However, as the channel area between the source and the drain becomes shorter due to the high integration of the drain, a short-channel effect may occur due to the shortened channel area. The short channel effect may cause a hot-carrier effect and a punch-through effect.

The hot-carrier effect indicates that carriers (electrons or holes) in a transistor channel of the semiconductor device may affect operational characteristics of the semiconductor device after acquiring high energy from an external electric field. In the case of the hot-carrier effect, the mobility of electrons may be higher than that of holes. This may cause the electron effect to imposes a negative influence upon operational characteristics of the semiconductor device as compared to the hole effect. The hot-carrier effect may deteriorate electric characteristics and reliability of the semiconductor device. Therefore, to reduce the short channel effect, a lightly doped drain (LDD) structure, which may have low-concentration impurity distribution, may be located between the drain area and the channel area, or the ion implantation process between the drain and the channel may be executed, which may minimize the hot-carrier effect or the punch-through effect.

Figure 1:
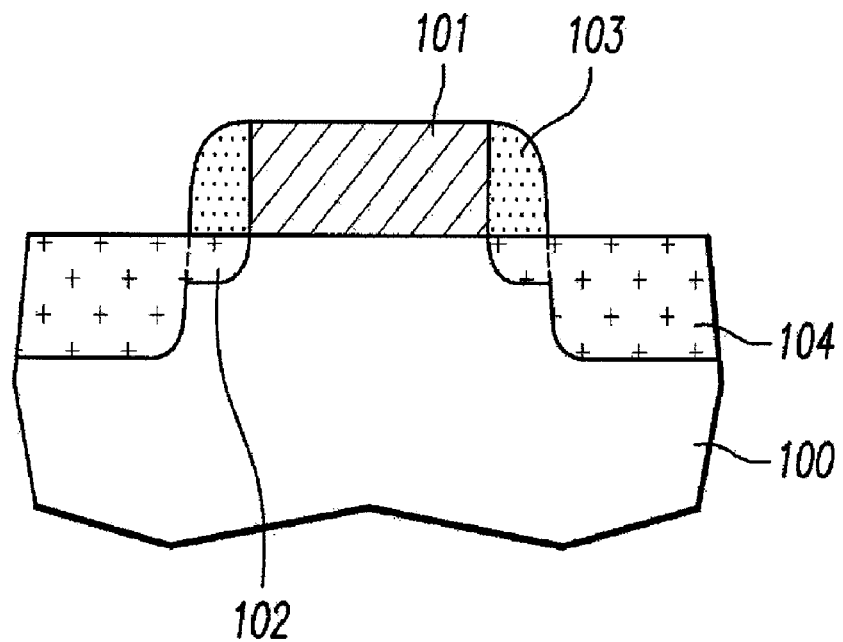

FIG. 1 is a cross-sectional view illustrating a related art method of manufacturing a MOSFET of a semiconductor device.

Referring to FIG. 1, the gate oxide layer and the gate conductive layer may be sequentially formed on semiconductor substrate 100 including the shallow trench isolation (STI) layer (not shown). The gate conductive layer and the gate oxide layer may be etched to form gate electrode 101. Subsequently, the ion implantation of low concentration impurities may be executed on substrate 100, such that LDD area 102 may be formed in the surface of the active area of substrate 100 located at both sides of gate electrode 101. The insulation layer may be formed on the overall areas of semiconductor substrate 100 including gate electrode 101, and may be blanket-etched, such that spacer 103 may be formed on both sidewalls of gate electrode 101. Thereafter, an ion implantation of high concentration impurities may be executed on the resultant material, a thermal process may be then applied to the executed result, and source/drain area 104 may be formed in the surface of the substrate at sidewalls of gate electrode 101 including spacer 103, such that the MOSFET element may be completed.

The MOSFET element formed by the above-mentioned method employs the LDD structure and may improve the hot-carrier effect, and may restrain the hot-carrier effect. However, if unexpected problems occur in the ion implantation- or diffusion-process in the drain or source, operational characteristics of the MOSFET element may be unavoidably deteriorated by hot-carriers.

SUMMARY

Embodiments relate to a semiconductor device and a method for manufacturing a semiconductor device. Embodiments relate to a method for manufacturing a semiconductor device to locally form an oxide layer in a channel area under a gate electrode that may improve a hot-carrier effect, and may increase reliability of the semiconductor device.

According to embodiments, a method for manufacturing a semiconductor device may include forming insulation-layer patterns spaced apart from each other by a predetermined distance on a semiconductor substrate, forming a first oxide layer by applying a thermal oxidation process on the substrate exposed by the insulation-layer pattern, removing the insulation-layer pattern, forming a second oxide layer on the overall surface of substrate including the first oxide layer, forming a gate electrode on the second oxide layer, forming a lightly doped drain (LDD) area on an active area of the substrate located at both sides of the gate electrode, forming a spacer on both sidewalls of the gate electrode, and forming a source/drain area on the overall surface of substrate located at both sides of the gate electrode including the spacer.

According to embodiments, the first oxide layer may be formed as a local oxide layer using a LOCOS (Local Oxidation of silicon) in a channel area under the gate electrode.

According to embodiments, the first oxide layer may be formed in a channel area under the gate electrode, and may be formed at one side of a drain direction of the channel area.

According to embodiments, the first oxide layer may be thicker than the second oxide layer by two or three times.

According to embodiments, the insulation-layer pattern may be formed with a thickness of 1800~2000 Å using a nitride layer.

DRAWINGS

FIG. 1 is a cross-sectional drawing illustrating a related art method of manufacturing a MOSFET of a semiconductor device.

FIGS. 2A~2F are cross-sectional drawings illustrating a MOSFET of a semiconductor device and a method for manufacturing a MOSFET of a semiconductor device according to embodiments.

DESCRIPTION

Figure 2A:
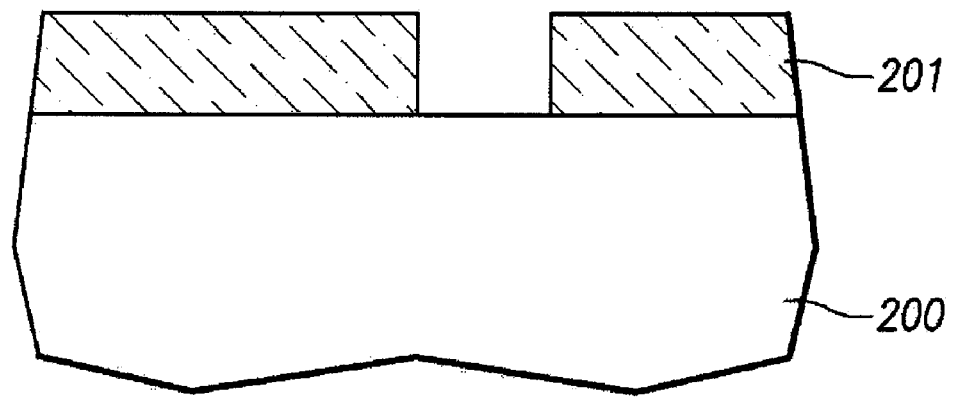

Referring to FIG. 2A, an insulation layer may be coated on semiconductor substrate 200, and may be continuously etched until the silicon of the substrate 200 may be exposed. Insulation patterns 201 spaced apart from each other by a predetermined distance may thus be formed. According to embodiments, the insulation-layer pattern may have a thickness of approximately 1800~2000 Å using the nitride layer. Insulation-layer pattern 201 may be used as a mask to form a local oxide layer in the subsequent process.

Figure 2B:
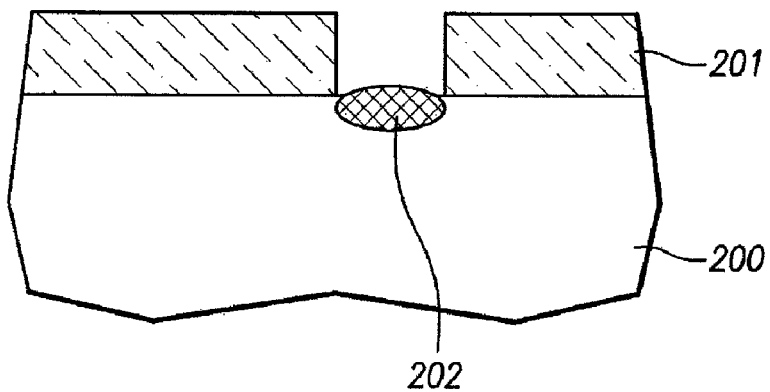

Referring to FIG. 2B, after insulation-layer pattern 201 may be formed, the thermal oxidation process may be performed on the silicon area located on the exposed substrate. First oxide layer 202 may thus be locally formed. In embodiments, first oxide layer 202 may be formed as a local oxide layer using the LOCOS (local oxidation of silicon) in the channel area under the gate electrode. According to embodiments, first oxide layer 202 may be formed in the channel area under gate electrode 204, and may be formed at one side of the drain direction of the channel area.

Figure 2C:
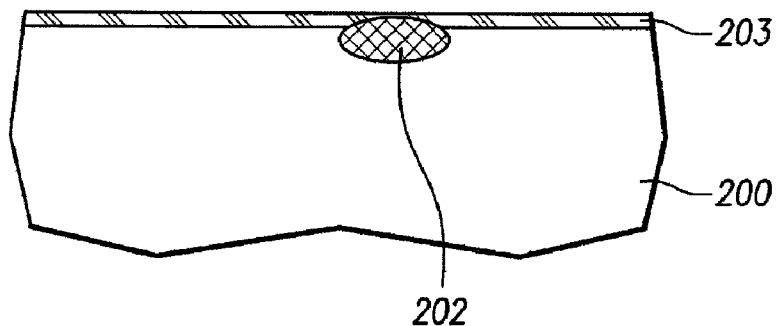

Referring to FIG. 2C, after insulation-layer pattern 201 may be removed, second oxide layer 203 may be formed on the overall surface of substrate 200 including first oxide layer 202. According to embodiments, first oxide layer 202 may be thicker than second oxide layer 203 by about two or three times.

Figure 2D:
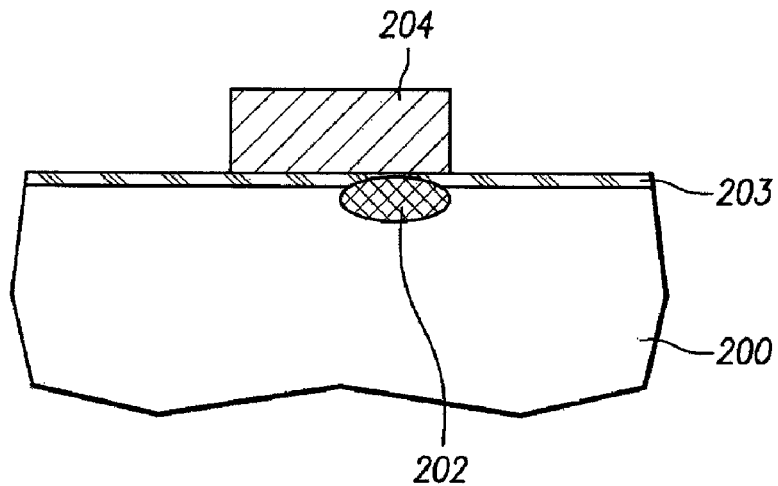

Referring to FIG. 2D, the gate conductive layer for forming the gate electrode may be coated and etched, so that gate electrode 204 may be formed.

Figure 2E:
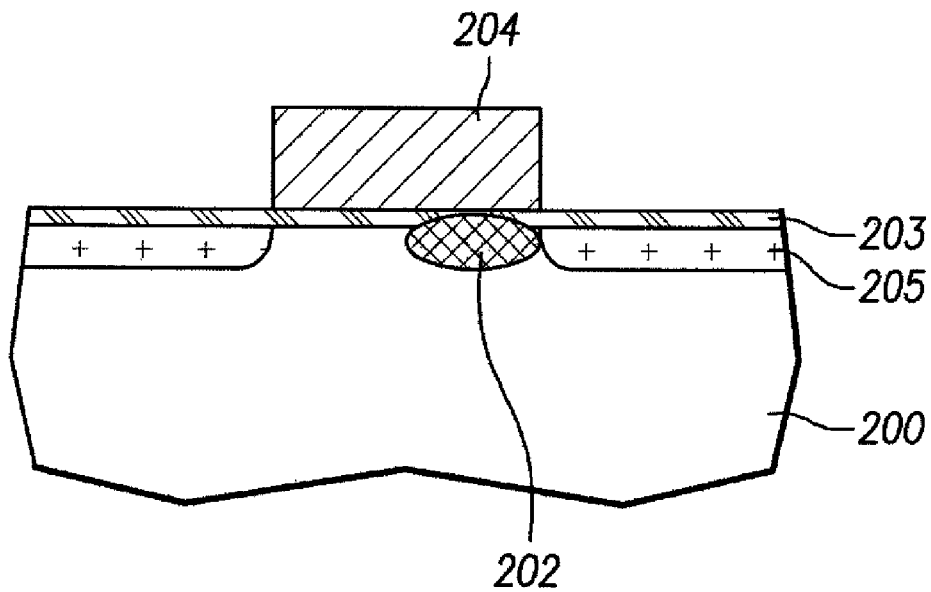

Referring to FIG. 2E, a tilt ion implantation may be executed on the resultant material of substrate 200, that is, the impurity ion of low concentration (e.g., N− ion) may be implanted on the substrate under sides of gate electrode 204, such that LDD area 205 may be formed in the surface of the active area of the substrate 200 located at both sides of gate electrode 204.

Figure 2F:
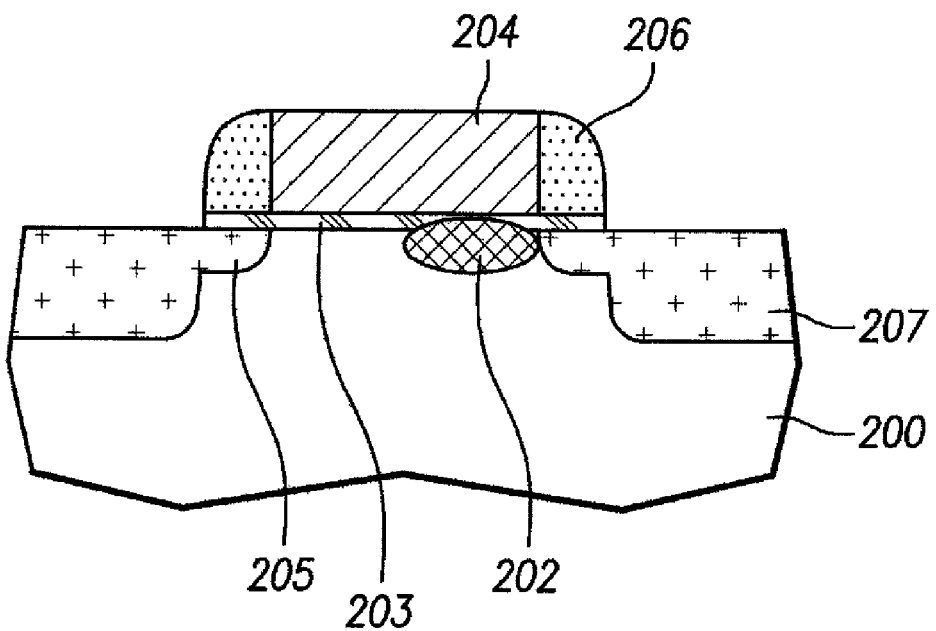

Referring to FIG. 2F, the insulation layer may be deposited on the overall surface of substrate 200 equipped with gate electrode 204 using the chemical vapor deposition (CVD) process. In embodiments, the insulation layer may be formed as a single-layer structure composed of an oxide or nitride layer, or may be formed as a laminated structure of the oxide and nitride layers. In the state that the insulation layer may be deposited, the insulation layer may be etched by the dry-etching process (e.g., the RIE (Reactive Ion Etching) process) having anisotropic etching characteristics. Therefore, the insulation layer may be left on only both sidewalls of gate electrode 204, and spacer 206 may thus be formed.

An impurity (e.g., N+ ion) of high concentration for forming the source/drain area 207 may then be implanted. According to embodiments, the high concentration P (phosphorous) ion of P+ type may be implanted on the overall surface of substrate 200, such that the source/drain area 207 may be formed.

Therefore, the electric field loaded on the gate electrode may be reduced when the electrons may be injected from the source to the drain by a thick oxide layer in the channel area under the gate electrode for operation of transistor, such that the acceleration of electrons may be reduced. As a result, electrons injected in second oxide layer 203 may be restrained, so that the hot-carrier effect may be improved.

According to embodiments, a first oxide layer in a channel area under the gate electrode may be locally formed, which may reduce an electric field loaded on the gate electrode when electrons are injected from the source to the drain. This may reduce an acceleration of electrons, and may restrain the electrons injected in the second oxide layer. As a result, the hot-carrier effect may be improved, which may result in an increased reliability of the semiconductor device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device, comprising:
   a first oxide layer in a portion of a semiconductor substrate;
   a second oxide layer over a surface of the substrate including the first oxide layer;
   a gate electrode over the second oxide layer;
   a lightly doped drain (LDD) area in the surface of an active area of the semiconductor substrate located at both sides of the gate electrode; and
   a source/drain area in the surface of the semiconductor substrate located at both sides of the gate electrode,
   wherein the first oxide layer is formed in a channel area under the gate electrode and is formed in direct contact with one side of a drain direction of the channel area.

2. The device of claim 1, wherein the first oxide layer is formed by:
   forming insulation-layer patterns spaced apart from each other by a predetermined distance over the semiconductor substrate;
   forming the first oxide layer by applying a thermal oxidation process on the semiconductor substrate at areas exposed by the insulation-layer pattern; and
   removing the insulation-layer pattern after forming the first oxide layer.

3. The device of claim 2, wherein the insulation-layer pattern is formed with a thickness of 1800~2000 Å using a nitride layer.

4. The device of claim 1, further comprising a spacer formed on each sidewall of the gate electrode.

5. The device of claim 1, wherein the first oxide layer is formed as a local oxide layer using a LOCOS (Local Oxidation of silicon) in the channel area under the gate electrode.

6. The device of claim 1, wherein the first oxide layer is thicker than the second oxide layer.

7. The device of claim 6, wherein the first oxide layer is two to three times thicker than the second oxide layer.

8. The device of claim 1, wherein a portion of the first oxide layer is protruded from a top surface of the semiconductor substrate and covered by the second oxide layer.

9. The device of claim 1, wherein the first oxide layer is in direct contact with the second oxide layer.

* * * * *